Jan. 3, 1967 R. ADLER 3,296,548

NEGATIVE SYNCHRONOUS WAVE AMPLIFIER AND OSCILLATOR

Original Filed June 27, 1961 3 Sheets-Sheet 1

INVENTOR.
Robert Adler

BY
Hugh D. Drake
Atty.

NEGATIVE SYNCHRONOUS WAVE AMPLIFIER AND OSCILLATOR

Original Filed June 27, 1961 3 Sheets-Sheet 2

INVENTOR.
Robert Adler
BY Hugh D. Drake
Atty.

NEGATIVE SYNCHRONOUS WAVE AMPLIFIER AND OSCILLATOR

Original Filed June 27, 1961 3 Sheets-Sheet 3

INVENTOR.
Robert Adler
BY
[illegible]
Atty.

United States Patent Office 3,296,548

Patented Jan. 3, 1967

3,296,548

NEGATIVE SYNCHRONOUS WAVE AMPLIFIER AND OSCILLATOR

Robert Adler, Northfield, Ill., assignor to Zenith Radio Corporation, Chicago, Ill., a corporation of Delaware Original application Jan. 27, 1961, Ser. No. 119,931. Divided and this application July 13, 1966, Ser. No. 564,858

5 Claims. (Cl. 330—46)

Figure 1:
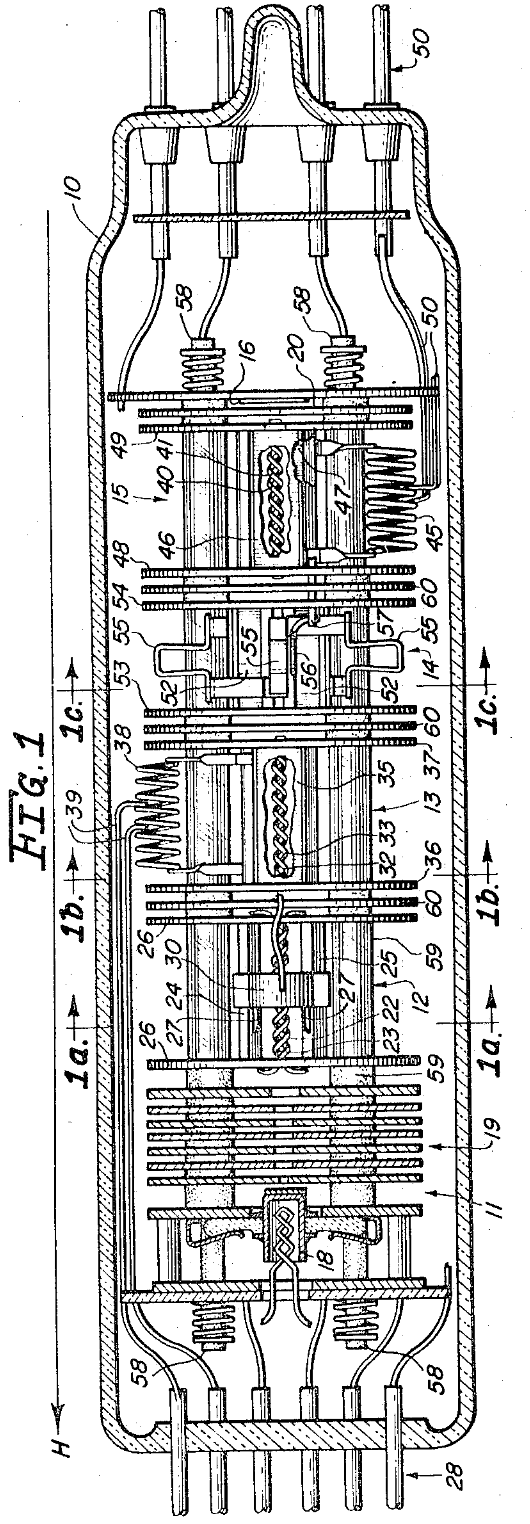

This application is a division of copending application Serial No. 119,931 filed June 27, 1961, by Robert Adler and assigned to the same assignee.

The present invention pertains to electron beam amplifiers and apparatus therefor. It has particular reference to electron couplers and combinations therewith.

As disclosed in the copending application of Robert Adler, Serial No. 738,546, filed May 28, 1958, for Electronic Signal Amplifying Apparatus and Methods, now Patent No. 3,233,182, and assigned to the same assignee as the present application, of which the aforesaid parent application is a continuation-in-part, it is known that interaction between electron beams and circuits placed alongside such beams can take different forms. That application specifically describes apparatus which interacts with and amplifies either of two distinct electron waves, the fast and slow electron waves which have velocities respectively faster and slower than the average electron beam velocity along the beam path. Electron wave action may be considered as characteristic of an electron beam which is subjected to a restoring force tending to establish a resonant or elastic suspension for the beam electrons. In transverse-field tubes, the restoring force enables each electron in the beam to oscillate about its rest position at a frequency known as the transverse or cyclotron resonance frequency. Motion of the electrons in the beam at the electron resonant frequency, once excited, persists until disturbed by some other mechanism such as an amplifying section or an output section.

Electron motion may be excited by a helix or equivalent circuit which has a velocity of wave propagation properly selected so that the electrons are subjected to a signal field at the electron resonance frequency. The conventional traveling wave tube exemplifies that type of device in which the interaction process develops slow waves. On the other hand, certain electron couplers described in the aforesaid copending application are characterized by interaction with the electrons to develop fast wave signal energy on the electron beam. One such coupler is of the lumped-electrode type which is characterized by its property of infinite phase velocity. This device exhibits maximum interaction with the beam when the applied signal frequency equals the electron resonance frequency. However, for certain applications, a coupler is required which optionally interacts at signal frequencies different from the electron resonance frequency.

In addition to fast and slow cyclotron waves, signal energy may be carried on an electron beam by the synchronous waves. The detailed characteristics of synchronous waves are described in an article entitled "Waves on a Filamentary Electron Beam in a Transverse-Field Slow-Wave Circuit by A. E. Siegman and appearing in the Journal of Applied Physics, Volume 31, No. 1, pages 17–26 for January 1960. Synchronous wave energy appears in two different forms, the positive-energy carrying wave and the negative-energy carrying wave; for simplicity, these two waves will be referred to hereinafter simply as the positive and negative synchronous waves. Since both of these waves have the same phase velocity, it is not possible to distinguish between them in the manner that couplers distinguish between fast and slow cyclotron waves.

It is a general object of the present invention to provide a new and improved electron coupler having utility in one or more of the applications discussed above.

Another object of the present invention is to provide a new and improved electron coupler capable of efficiently exciting resonant electron signal motion for signal energy at a frequency other than that of electron resonance.

A further object of the present invention is to provide a new and improved electron coupler capable of selectively interacting with and distinguishing between synchronous waves.

A related object of the present invention is to provide new and improved apparatus for amplifying synchronous wave energy.

In one aspect of the present invention, an electron coupler is designed for interaction with a synchronous wave. The coupler includes a bifilar helix which is coaxial with the electron beam path and has a pitch such that $$n = n_c \frac{f}{f_c}$$

where $n$ is the number of helix turns per unit length, $n_c$ is the number of electron cyclotron orbits per unit length and $f_c$ is the electron cyclotron frequency, the average electron velocity being equal to $f/n$ and establishing a condition of synchronous-wave operation in all active sections of said device.

In a synchronous wave amplifier constructed in accordance with the invention, the bifilar helix electron coupler is arranged to subject the electron to interacting transverse field forces which travel synchronously with the electrons of the beam. When the synchronous wave thus developed is of the negative type, amplification of the synchronous wave energy is achieved by coaction of the synchronous wave with the coupler.

Figure 1C:
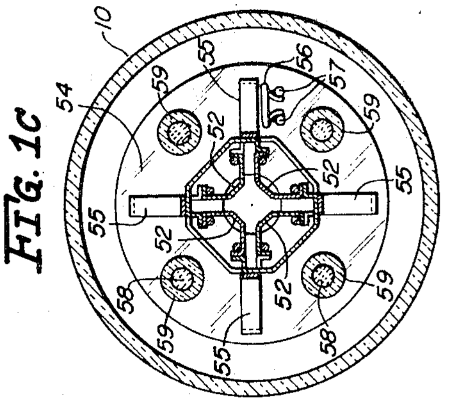
Figure 1B:
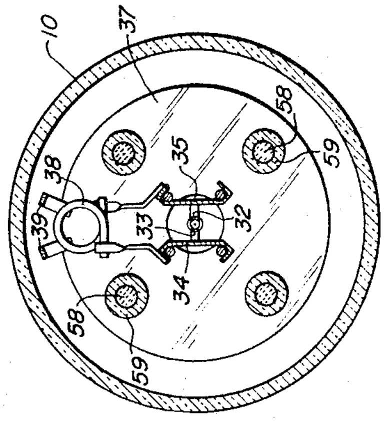
Figure 1A:
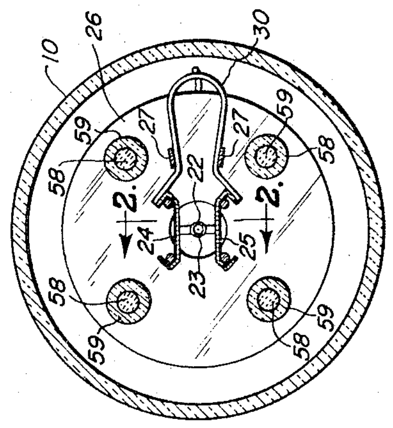
Figure 2:
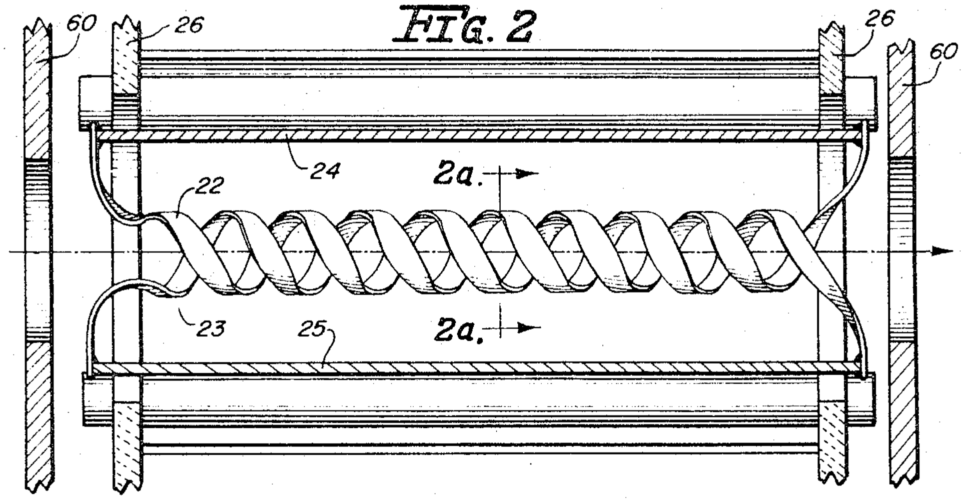
Figure 2A:
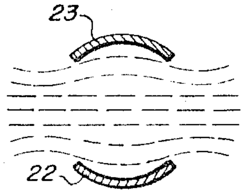

The features of the present invention which are believed to be novel are set forth with particularity in the appending claims. The organization and manner of operation of the invention, together with further objects and advantages thereof, may best be understood by reference to the following description taken in connection with accompanying drawings, in the several figures with which like reference numerals identify like elements and in which:

FIGURE 1 is an elevational view, partially broken away, of one embodiment of the present invention;

FIGURES 1*a*, 1*b*, and 1*c* are cross-sectional views taken along the lines 1*a*—1*a*, 1*b*—1*b*, and 1*c*—1*c*, respectively, in FIGURE 1;

FIGURE 2 is an enlarged fragmentary view of a portion of the apparatus shown in FIGURE 1;

FIGURE 2*a* is an enlarged fragmentary cross-sectional view taken along the lines 2*a*—2*a* in FIGURE 2; and FIGURES 3–11 are schematic diagrams each depicting a different embodiment of the invention claimed herein, in the parent hereof or in another division of the latter.

Referring to FIGURE 1 which serves to illustrate the present invention as will become apparent later, enclosed within an evacuated envelope 10 are an electron gun 11, first and second input couplers 12 and 13 disposed in a first beam path portion beyond gun 11, a parametric electron motion expander 14 disposed in a second beam path portion beyond the first, an output coupler 15 disposed in a third path portion beyond expander 14, and a collector 16. In operation, the entire electron beam path is subjected to a longitudinal magnetic field indicated by arrow H. It is usually most convenient to develop the magnetic field by means of a solenoid (not shown) within which envelope 10 is coaxially disposed.

Electron gun 11 is designed to develop and project along the beam path a pencil-like stream of electrons at least approximating a condition of Brillouin flow. To this end, the gun includes a cathode 18 followed by a series of annular electrodes 19. The aperture in the first electrode beyond the cathode is small so as to accept only a central portion of the electron stream emitted from cathode 18. The annular electrodes are spaced and energized so as to first confine the beam essentially to a cross-over, simulating a point source, and then permit the beam to expand and attain that diameter at which the divergent space charge forces are balanced by the confining force of the magnetic field. The electrons projected along the beam path from gun 11 are finally intercepted by collector 16 after passing suppressor electrode 20. The average axial velocity of the electrons is adjusted by the potential applied to the elements in each of the intermediate sections 12–15.

Input section 12 is an electron coupler which interacts with the beam electrons at a desired interaction signal frequency $f$. Two conductive strips 22, 23 (FIGURES 1*a*, 2 and 2*a*) are interleaved and wound coaxially about the beam path to form a bifilar helix coaxial with the path. Strip 22 is electrically and mechanically connected at each of its ends to a support 24 disposed along one side of the beam path. Strip 23 is similarly connected at each of its ends to a support 25 on the opposite side of the beam path. Supports 24 and 25 are mounted between insulating spacers 26. The coupler is tuned to its interaction frequency by an inductive loop 30 connected across supports 24, 25. Suitable conductive leads 27 connect opposite sides of loop 30 with appropriate base pins 28 extending through one end of envelope 10.

The frequency at which the coupler interacts with the beam electrons is a function of its pitch and direction of twist relative to the periodicity and direction of the resonant electron motion. For the general case of transverse resonant motion of the electrons, the pitch of the coupler must correspond with that of the electron wave pattern. The number of $n_r$ of resonant motion periods per unit length is expressed by the equation $$n_r=\frac{f_r}{u} \qquad (1)$$

where $u$ is the average electron velocity in the axial direction and $f_r$ is the frequency of electron resonance. To interact properly with electron waves, the pitch of the bifilar helix coupler must be such that $$n=n_r\left(1-\frac{f}{f_r}\right) \qquad (2)$$

where $n$ is the number of helix turns per unit length and $f$ is the desired interaction frequency.

More specifically with respect to the device illustrated in FIGURE 1, the application of signal energy to the electron beam causes the electrons to follow helical orbits having a periodicity determined by the strength of magnetic field H in accordance with the well understood cyclotron relationship; the cyclotron frequency $f_c$ in megacycles is equal to 2.8H, where H is the strength of the field in gauss. From Equation 1, the number $n_c$ of cyclotron orbits per unit length is expressed by $$n_c=\frac{f_c}{u} \qquad (3)$$

Similarly from Equation 2, the pitch of the bifilar helix must be such that $$n=n_c\left(1-\frac{f}{f_c}\right) \qquad (4)$$

By constructing coupler 12 in accordance with Equation 4, its interaction frequency is optimized at a value which is different from the cyclotron frequency. In the specific embodiment shown, coupler 12 has a twist opposite that of the orbital electron paths in order to be operative at an interaction frequency higher than the cyclotron frequency. This is in accordance with Equation 4 which gives a negative sign to $n$ for $f>f_c$. Defining the direction of field H indicated in FIGURE 1 as that which produces counter-clockwise clockwise orbital trajectories as viewed from the cathode, coupler 12 in this instance is twisted in the clockwise direction.

To interact properly with the beam, the bifilar strips should develop a homogeneous field in the region traversed by the electrons. As shown in FIGURE 2*a*, this condition is approximated by curving the strip transverse cross-section to present an inwardly facing concave surface. Each of the strip transverse cross-sections may extend about 90° around the beam path and the radius of the coupler preferably is such that its pitch is larger than its circumference.

Electron coupler 13 in the instant embodiment is structurally similar to electron coupler 12. However, its assigned interaction frequency is lower than the cyclotron frequency so that it is twisted in the opposite direction from coupler 12, i.e., in the same direction as the cyclotron orbits, as indicated by the resultant sign of Equation 4. It includes two strips 32, 33 (FIGURE 1*b*) respectively on supports 34, 35 secured between micaspacers 36, 37. An inductance coil 38 connected across supports 34, 35 tunes coupler 13 to its interaction frequency. Connecting leads 39 are tapped across coil 38 and extend through the end of envelope 10 by way of appropriate ones of base pins 28.

Output section 15 is essentially identical in this instance to input section 13. It includes a bifilar helix composed of strips 40 and 41 twisted in the same direction and with the same pitch strips 32, 33. It is tuned to its interaction frequency by an inductane coil 45 bridged across supports 46, 47 secured between spacers 48, 49. Leads 50 extend from appropriate impedance-matching taps on coil 45 through the other end of envelope 10 by way of base pins 50.

Expander section 14 may take the form of any device appropriate to parametrically amplify the signal energy imposed upon the beam by one of the input signal sections. In the preferred embodiment illustrated in FIGURE 1, amplification is achieved by means of a quadrupole parametric expander. This particular expander is described and claimed in the co-pending application of Glen Wade, Serial No. 747,764, filed June 10, 1958, entitled Parametric Amplifier, and assigned to the same assignee as the present invention. It has also been described in an article entitled a Low-Noise Electron-Beam Parametric Amplifier by Adler et al. which appeared in the Proceedings of the IRE, Volume 46, No. 10, for October 1958. The expander includes four electrodes 52 spaced circumferentially around the beam path and supported between insulating spacers 53, 54. Connected between each adjacent pair of electrodes 52 is an inductive loop 55, the loops together tuning the structure to the frequency $f_p$ of the pump signal to be applied from an external pump source. The latter signal is inductively coupled to one of loops 55 by a feed loop 56 fed with the pump signal energy by suitable leads 57 extending through the end of envelope 10 by way of appropriate ones of base pins 50. Oppositely facing ones of electrodes 52 are strapped together to insure operation in the pi mode.

The entire assembly is rigidly supported by means of insulator rods 58 which pass through openings in the different annular electrodes and insulating spacers supporting the individual sections and related parts. Insulating sleeves or washers 59 disposed over rods 58 space the different sections along the beam path. Shielding between the different sections is afforded by centrally apertured electrodes 60 aligned between each of the different sections. Loops and coils 30, 38, 45 and 55 are connected at their electrical center to the adjacent one of shield electrodes 60 in order to minimize the development of stray fields. Coupling between the different sections is further minimized by orienting successive sections at 90° with respect to each other. If desired, losses may be reduced by the use of inductive or capacitive coupling directly to each of the sections through envelope 10, instead of by means of the connecting leads and base pins.

In operation, input coupler 13 and output coupler 15 are constructed to interact with the electron beam at the frequency $f_s$ of the input signal to be amplified in expander section 14. When coupler 13 is fed by energy from the external input signal source, the electrons passing through the coupler describe expanding helical orbits, the periodicity of which is that of the established cyclotron resonance frequency and the radius of which is proportional to the strength of the input signal.

Upon subsequently entering expander section 14, the electrons are subjected to a periodic inhomogeneous quadrupole field which imparts energy to the electron signal motion and thereby amplifies the signal intelligence. The amplified signal intelligence is derived from the beam in output coupler 15 and fed to an external load coupled thereto. The orbiting electrons give up energy to the bifilar helix of coupler 15 in a manner reciprocal to the action of input coupler 13.

The pump signal frequency $f_p$ is approximately twice the cyclotron frequency $f_c$. As a result of the parametric amplification process, the idler signal $f_i$ is developed at a frequency which is in this case higher than the cyclotron frequency. Noise energy on the electron beam at the idler frequency is capable of being converted, during the parametric amplification process, to the input signal frequency as a result of which it appears in the output signal. To minimize this, the idler frequency noise components are stripped from the beam prior to the amplification process. The idler stripping is achieved by coupler 12 which interacts at the higher idler frequency. Idler signal coupler 12 preferably is coupled to and terminated in an external noise sink properly matched thereto.

To illustrate the operational relationships of the different sections, and in no sense by way of limitation upon the structure, it may be assumed that the magnetic field strength is of a value establishing cyclotron resonance at 1,000 megacycles. The frequency of the pump signal applied to expander 14 is 2,000 megacycles. The bifilar helix of coupler 13 is wound in the same direction as the direction of cyclotron motion and its pitch is selected in accordance with Equation 4 so that its interaction frequency is 400 megacycles. Because the idler signal developed by the parametric process has a frequency equal to the difference between the input and pump signal frequencies, electron coupler 12 is constructed to interact at 1600 megacycles. Its pitch also is determined in accordance with Equation 4 and its direction of twist is opposite that of the electron cyclotron motion. The 400 megacycle input signal energy is modulated upon the beam in coupler 13, amplified in expander 14, and extracted by output coupler 15. Noise energy components at the 1600 megacycle idler frequency are stripped from the beam by coupler 12, in this case prior to entry of the beam into input coupler 13, and therefore are removed prior to the parametric amplification process which would convert a portion of the noise energy to the input signal frequency at which the output coupler interacts.

Numerous combinations of the described bifilar helix couplers with different kinds of input, expander, and output sections permit varied operational results. In all cases, amplifying section 14 is constructed to subject the electrons to a pump signal field which has a wave number equal to the algebraic sum of the signal and idler wave numbers, the wave number being the number of waves per unit length. In the input and output sections the wave number is equal to the number of turns per unit length, previously defined as $n$, with the same positive or negative sign. The illustrated signal expander exhibits an infinite phase velocity for the pump signal wave, while the couplers themselves exhibit a finite phase velocity in the conventional sense; however, it is important to note that the action of the above described couplers is that of a lumped-electrode device, as opposed to the distributed action normally associated with waves traveling at a finite velocity. Lumped-electrode action is assured by connecting both ends of each helix element to the same support element. Even without the common end connections, lumped action occurs so long as the electrical length of the conduction elements or strips 22, 23 etc. does not exceed one-half free-space wavelength at the frequency at which they operate. Because on a lumped element phase is the same everywhere at a given instant, the spacing and the twist of the turns corresponds to the spacing and twist of the cyclotron wave with which the coupler interacts.

Figure 3:
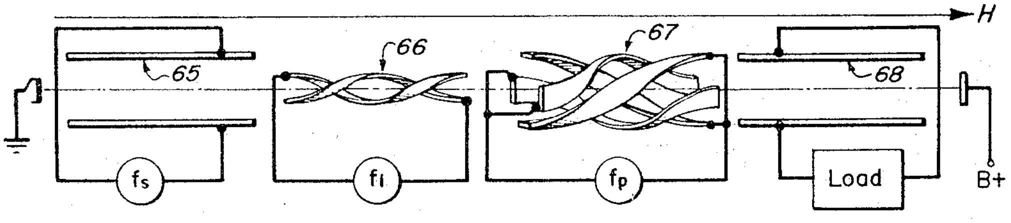

Another embodiment is illustrated schematically in FIGURE 3 in which the characteristics of the different sections are again selected so as to separate the idler and signal frequencies. In this instance, the principal sections of the device include an infinite phase velocity input signal coupler 65, a bifilar helix coupler 66 constructed to interact at the idler frequency, a quadrupole parametric expander 67 the four electrodes of which are skewed around the beam path, and an infinite phase velocity output coupler 68.

The input and output couplers 65, 68 are constructed of a simpler pair of deflector plates disposed on opposite sides of the beam path. The lumped capacitance of the deflection plates is tuned to the interaction frequency by a suitable matching network between the coupler and the external signal source or load. The action of coupler 65, 68 is fully described in the aforementioned Adler application Serial No. 738,546 and also is discussed in detail in an article by Adler et al. entitled Parametic Amplification of the Fast Electron Wave which appeared in the Proceedings of the IRE for June 1958, volume 46, No. 6. The interaction frequency of couplers 65, 68 is optimum at the cyclotron frequency established by magnetic field H.

Quadrupole 67 is skewed in the manner disclosed and claimed in the aforementioned Wade application so as to properly respond to a pump signal having a frequency different from twice the cyclotron frequency. The amount by which the quadrupole electrodes are twisted about the beam path is such that by Doppler effect the orbiting electrodes "see" a quadrupole pump field alternating at twice the cyclotron frequency. This is compatible with the condition that the wave number of the pump field must be equal to the sum of the idler and input signal wave numbers.

Idler noise stripper 66 is assigned a pitch such that its number of turns per unit length corresponds to the idler wave number. Assuming, for example, that it is desired to separate the idler and signal frequencies so that the idler frequency is 1.3 times the input signal frequency, from Equation 4 the number of turns per unit length of the idler signal coupler 66 is .3 times the number of cyclotron orbits per unit length. Since the idler signal frequency is higher than the cyclotron frequency, the direction of twist of coupler 66 is opposite that of the electron orbital motion. In this specific example, the signal wave number is zero and thus idler noise stripper 66 and quadrupole 67 have the same wave number. The amount by which the quadrupole electrodes are skewed therefore is such that the pump frequency is 2.3 times the cyclotron frequency.

It has been found that the interaction effects of a finite phase velocity coupler tend to deteriorate gradually as the electron beam moves on beyond such a coupler. For this reason, the idler coupler of FIGURE 3 is disposed in the initial beam path portion beyond input signal coupler 65 in order to perform its function just prior to the parametric amplification process effected by quadrupole expander 67. In general, however, the order of arrangement of the two electron couplers along the initial beam path portion may be reversed.

Figure 4:
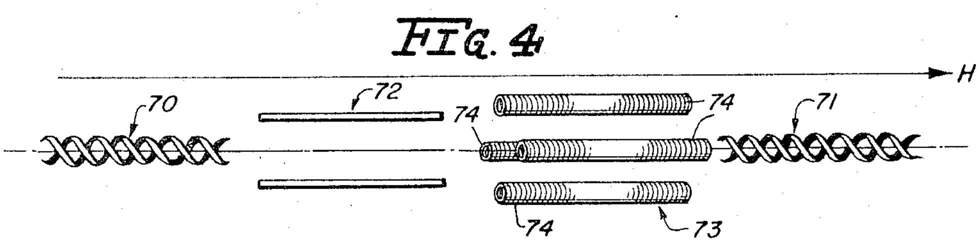

Another embodiment of the present invention as shown in FIGURE 4 employs input and output couplers 70, 71 constructed to interact with input signal waves of finite phase velocity. An idler coupler 72 interacts at an infinite phase velocity, and a traveling-wave type parametric expander 73 serves to amplify the input signal waves. Expander 73 is composed of four helices 74 spaced circumferentially around the beam path and individually oriented parallel thereto. In a geometrical sense, the device of FIGURE 4 is somewhat the converse of that illustrated in FIGURE 3. Idler coupler 72 interacts with the electron beam at the cyclotron frequency. Separation between the idler and signal frequencies is obtained by the use of bifilar helix couplers 70 and 71 to which a pitch is assigned such that they interact at a desired input signal frequency lower than the cyclotron frequency. In this instance, the idler wave number is zero and the wave numbers of signal couplers 70, 71 and expander 73 are the same. Accordingly, the pump signal applied to parametric expander 73 has a frequency less than twice that of the cyclotron resonance condition. Because of the lower signal frequency, the signal wave travels toward the cathode and the pump signal therefore is fed to the end of helices 74 nearest the collector. For clarity in this and subsequent figures the actual connections to the various sections, as well as the cathode and collector, have been omitted in the drawings; except as otherwise noted herein, the arrangements are the same as depicted in FIGURE 3, with the cathode on the left.

Figure 5:
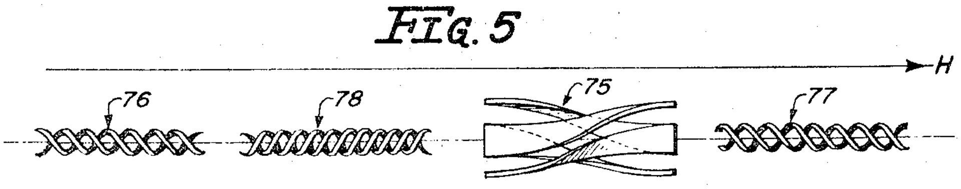

Still another embodiment of the present invention is shown in FIGURE 5. All four sections of the device are constructed for waves having a finite phase velocity. Quadrupole expander 75 is skewed in the manner of expander 67 discussed in connection with FIGURE 3 so as to respond to a frequency different from twice the cyclotron frequency established by mangetic field H. Input and output electron couplers 76 and 77, respectively, are assigned a pitch in accordance with Equation 4 to establish an interaction frequency less than the cyclotron frequency. The bifilar helix of electron coupler 78 is assigned a pitch for interaction at an idler frequency higher than the cyclotron frequency. Because of the invariant relationship which must exist between the wave numbers of the three different signal frequencies involved, the wave number (or correspondingly the number of turns per unit length) of idler coupler 78 is in this embodiment separated from the cyclotron frequency by an amount different from the amount by which the input signal frequency departs from the cyclotron frequency; accordingly, its pitch is tighter than that of the other couplers.

Considering the embodiments of FIGURES 1–5 in retrospect, it will be apparent that the use of different combinations of finite and infinite phase velocity sections enables separation of idler and signal frequencies while yet meeting a variety of different signal specifications. By assigning a number of turns per unit length in accordance with Equation 4, the desired signal frequency may be caused to interact properly at the cyclotron frequency of the device. The direction in which the interaction frequency departs from the cyclotron frequency is determined by the relative direction of twist of the helix as compared with that of the cyclotron orbits.

The embodiments discussed thus far have each included a gain or amplifying section. When this section is not used, or is omitted entirely from the tube, the resultant device retains utility in service as an isolator because it will translate signal energy only in the direction of electron travel. Alternatively, a mixer or amplitude modulator section may be interposed along the beam path between input and output couplers. Still further, the idler stripping coupler may be omitted when the tube is to be utilized in applications where the noise of the idler channel may be disregarded.

As described above, the electron couplers of the invention are constructed to interact with the fast electron wave. Interaction with slow electron waves likewise is achievable with the bifilar helix couplers. To this end the coupler is constructed in accordance with Equation 2 or 4 with a negative sign accorded to the signal frequency term $f$. Hence. the pitch of the coupler always is positive, designating a coupler twist in the same direction as that of the cyclotron orbits. For a given electron velocity $u$, the number of turns $n$ will be larger for interaction with a slow wave than with a fast wave. On the other hand, any of the couplers previously described interact with the slow wave upon an appropriate increase in the electron velocity $u$. As thus far described, the invention is claimed in the parent application hereof.

Figure 6:
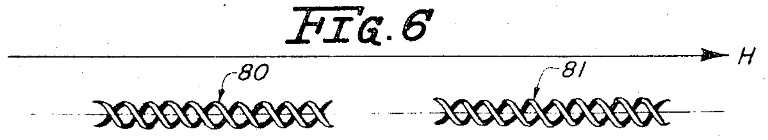

The present invention also pertains to apparatus in which the signal energy is carried by the synchronous electron wave. As explained in the aforementioned article by Siegman, synchronous waves differ from cyclotron waves in several respects. Two different synchronous waves may exist on the beam, one of which is defined as a positive energy-carrying wave and the other of which is a negative energy-carrying wave. For convenience, these two waves will hereinafter be referred to simply as the positive and the negative synchronous waves. In some respects, these two waves appear to correspond with the slow and fast cyclotron waves. Couplers for interacting with cyclotron waves are capable of distinguishing between the slow and fast waves by virtue of their different phase velocities. However, separation on the basis of phase velocity is not possible for synchronous wave interaction because the positive and negative synchronous waves have the same phase velocity. To selectively interact with but one of the synchronous waves, an electron coupler must be constructed to develop fields in two coordinate directions transverse to the beam path. The bifilar helix electron coupler structures of the present invention are uniquely suited to this requirement. A simple synchronous wave device is illustrated in FIGURE 6 which, as in FIGURES 4 and 5, diagrammatically illustrates only the essential elements of the device while not depicting the cathode, collector, source and load. Its basic sections are an input coupler 80 and an output coupler 81. Each of these couplers is physically constructed in the same manner as coupler 12 described with respect to FIGURE 1.

The electron pattern of a positive synchronous wave twists in the direction of the electron orbits. The couplers in the device of FIGURE 6 are specifically intended for interaction with the positive synchronous wave and therefore have a twist in the same direction as the orbital electron motion caused by magnetic field H. The pitch of couplers 80, 81, which must be the same as that of the synchronous wave electron pattern to interact therewith, is selected in accordance with the equation $$n=\frac{f}{u} \tag{5}$$

where $n$ is the number of helix turns per unit length, $f$ is the interaction frequency, and $u$ is the average axial electron velocity. Substituting from Equation 3, Equation 5 becomes $$n=n_c\frac{f}{f_0} \tag{6}$$

So constructed, the electron velocity is such that a given electron passes one complete turn of the helix for each signal cycle. The assumed electron effectively is under the influence of a D.C. field which causes the electron to drift at right angles to that field as well as to the axial magnetic field. Because of the circular symmetry of the bifilar helix, corresponding forces are exerted on all electrons and the direction in which any given electron moves depends on its phase at entry into the coupler section. Consequently, the pencil beam is spread into a corkscrew of growing diameter. The corkscrew pattern has the same direction of twist as the bifilar windings and in passing through the coupler structure the electron pattern induces current in the coupler at the signal frequency. In the present example, the phase of this current is such as to constitute a positive conductance load on the coupler. Thus, the device shown on FIGURE 6 constitutes a unidirectional signal energy translator in which the energy is carried on the electron beam by the positive synchronous wave.

In practice, the device of FIGURE 1 may be operated in the manner described with respect to FIGURE 6, merely by utilizing input and output couplers 13 and 15, disabling idler stripper 12 and expander 14, and properly adjusting the electron beam accelerating voltage so as to satisfy Equation 6. For example, with couplers 13 and 15 constructed as described for cyclotron wave interaction at 400 megacycles, lowering the beam voltage a few volts (in an exemplary tube from about 7 to 4 volts, true voltage) permits positive synchronous wave transmission.

Figure 7:
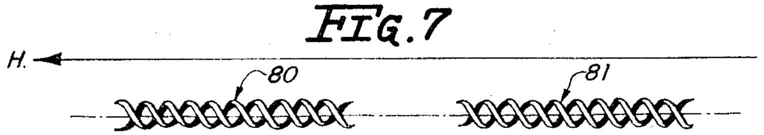

By reversing either the direction of twist of couplers 80, 81 in FIGURE 6 or the direction of magnetic field H, interaction with the negative synchronous wave is obtained since the twist of its electron pattern is opposite that of the positive synchronous wave. The later alternative is illustrated in FIGURE 7 in which couplers 80, 81 are the same as in FIGURE 6 but the direction of the magnetic field is reversed. Similarly, the device shown in FIGURE 1 may be caused to operate with a negative synchronous wave by reversing the current in the solenoid encircling the tube. In this mode of operation, the beam constitutes a negative conductance load upon the electron coupler. While there is no gain from coupler 80 to coupler 81, amplification is observed in this device because of the effective negative conductance in each of the couplers. In order to prevent oscillation, it is necessary to carefully load the two couplers respectively by the signal source and by the utilization device.

Figure 9:
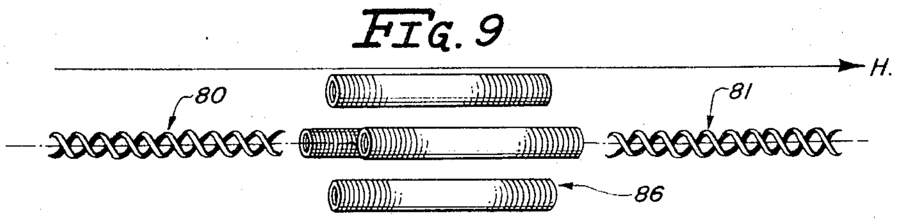
Figure 8:
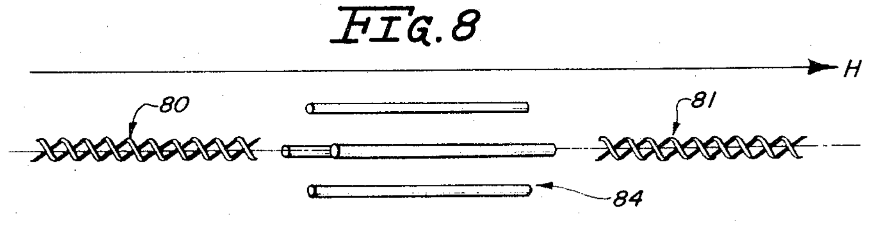
Figure 10:
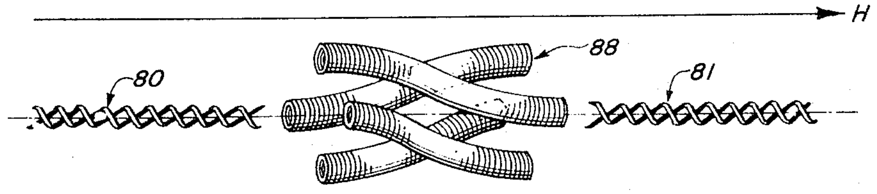

To amplify the positive synchronous wave, a parametric expander may be inserted between couplers 80, 81. Illustrative combinations are shown in FIGURES 8, 9 and 10. In FIGURE 8, a D.C. energized quadrupole parametric expander 84 is employed between couplers 80, 81. Quadrupole 84 is constructed in the manner of expander section 14 of the device illustrated in FIGURE 1. In this case, the two oppositely facing pairs of expander electrodes are connected across a D.C. potential source. In synchronous wave operation, the corkscrew pattern in which the electrons are arranged moves forward as a whole with the stream, while the individual electrons maintain their positions with reference to the beam axis. There is no transverse motion of the individual electrons involved. When the group of electrons arranged according to such a pattern enters the D.C. quadrupole field, which for simplicity may be thought to be concentric with the pattern axis, each individual electron finds itself in a D.C. field the strength of which is proportional to the spacing of the electron from the axis and the direction of which is related to the azimuth of the specific electron. There are four azimuthal positions where the D.C. field is purely tangential. Because in the magnetic field electrons move at right angles to the applied D.C. field, the electrons in the four positions just mentioned will move radially, two inward and two outward. As they so move, they drift radially into regions of weaker and stronger tangential field, respectively. Therefore, their transverse drift must be exponential with respect to time or axial distance.

At the end of the quadrupole, the original corkscrew pattern appears strongly distorted and flattened: it has grown exponentially along one transverse axis and has been squeezed together, also exponentially, along the other. The resulting pattern is almost flat; it can be thought of as consisting of two synchronous waves, one positive and one negative with both having the original signal frequency and being much larger in amplitude than the original pattern.

To summarize, the D.C. energized quadrupole amplifies one transverse component of the positive synchronous wave and suppresses the orthogonal transverse component. Noise components of the negative synchronous wave also are amplified.

The device shown in FIGURE 9 utilizes a quadrupole parametric expander 86 in which each of the four quadrupole electrodes is a simple helix. Any pump signal frequency may be selected by assigning a propagation constant to the helices such that the pump wave has a propagation velocity equal to the average axial electron velocity $u$. The pump signal is fed to the end of the helices nearest the cathode (to the left in FIGURE 9). The amplification mechanism is equivalent to that explained in connection with FIGURE 8; the individual electrons appear to see a D.C. field.

The device shown in FIGURE 9 also amplifies a second or idler synchronous wave at a frequency equal to the difference between the pump and signal frequencies. When this difference is positive the idler wave is a positive synchronous wave, permitting removal of beam noise by means of a bifilar helix coupler constructed in accordance with this invention. Pump structure 86 does not discriminate between positively and negatively rotating components of the pump field. For this reason, the same structure also amplifies negative synchronous waves, among them a wave at the signal frequency and another wave at the idler frequency. Beam noise of these negative energy-carrying waves cannot be removed, so that this device is not capable of amplification with extremely low noise.

FIGURE 10 shows a modification of the quadrupole pump structure in the form of four helices 88 spaced circumferentially around and twisted about the beam axis. When a pump signal is applied to the left or cathode end of this structure, a pump wave is generated the counter-rotating components of which have unequal angular velocities. The rotation resulting from the geometrical twist is added to one component but subtracted from the other. This device therefore pumps with a wave adapted to amplifying positive synchronous waves, with the correct axial velocity, while not similarly amplifying negative synchronous waves. Accordingly, low noise amplification is obtained when the pump frequency is higher than the signal frequency and the beam noise at the resulting positive idler wave is removed by a bifilar helix coupler of the invention.

Figure 11:
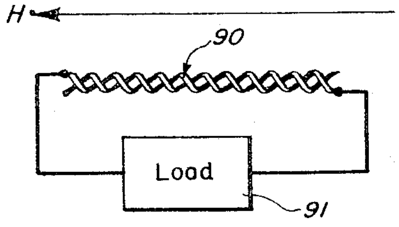

An interesting synchronous wave device is illustrated in FIGURE 11. It includes but a single bifilar helix coupler 90. The helix is wound in a direction opposite the direction of cyclotron rotation defined by magnetic field H. As described above with respect to FIGURE 1, the synchronous wave interaction process produces a negative conductance in coupler 90 which is connected across a load 91. Adjustment of the load to present a resistance larger than the amount of negative resistance impressed thereon by the electron beam causes the system to oscillate at the synchronous wave interaction frequency. Energy to sustain the oscillations is derived from the direct current field which accelerates the beam. Similar results are obtained by constructing coupler 90 to interact with the slow electron wave, as previously described.

The principles upon which the present invention are based are applicable to the development of a number of other synchronous wave devices. For traveling-wave interaction, the electron coupler must exhibit a phase velocity equal to the speed of electron travel, the apparent phase rotation of a given cross-section of the electron beam must have a clearly defined direction, such as the direction of electron motion in a magnetic field, and that same direction must be defined by the external circuit. Any such device must involve interaction in two coordinate transverse dimensions. For example, a synchronous traveling wave tube utilizing these principles may take the form of a helix coiled about the beam axis with a pitch such that the number of wavelengths on one major turn equals the number of synchronous wave lengths plus or minus one (depending on the direction of orbital electron rotation) on a corresponding length of the beam. This specific subject matter is described and claimed in the co-pending application of Robert Adler entitled Election Beam Devices, Serial No. 205,591, filed June 27, 1962, now Patent No. 3,218,503, and assigned to the same assignee as the present invention.

The numerous different embodiments disclosed illustrate the versatile applicability of a bifilar helix constructed to interact with the electron beam in the manner of a lumped-electrode coupler. As part of a fast wave amplifier, the electron coupler of the invention permits separation of signal and idler frequencies. It also serves to increase the flexibility of choice of the various different signal frequencies involved. The present application also describes several different synchronous wave devices. The bifilar helix electron coupler is especially suited for interaction with the synchronous wave because it satisfies the requirement of interaction in two transverse coordinate directions so that it may selectively interact with only one of the two synchronous waves. Claims specific to the positive synchronous wave mode of operation described herein, and also claims dominant to the invention claimed herein, appear in copending application Serial No. 564,856 filed July 13, 1966, which also is a division of the aforesaid application Serial No. 119,931.

While particular embodiments of the present invention have been shown and described, it will be obvious to those skilled in the art that changes and modifications may be made without departing from the invention in its broader aspects. Accordingly, the aim in the appending claims is to cover all such changes and modifications as fall within the true spirit and scope of the invention.

I claim:

1. A synchronous-wave signal energy translator and amplifier comprising:

means for projecting an electron beam along a predetermined path;

means for establishing cyclotron resonance for electrons in said beam;

a first electron coupler responsive to input signal energy for developing a field, having components in two coordinate directions transversely across said path and propagating along said path synchronously with said electrons, which imparts to said beam an electron pattern defining a negative synchronous wave and having a twist about said path in a direction opposite that in which said electrons orbit in correspondence with said cyclotron resonance;

and a second electron coupler, spaced along said path from said first coupler and coupled to a signal-energy load, for establishing a field having components in two coordinate directions transversely across said path and propagating along said path synchronously with said electrons to interact with the negative synchronous-wave defined by said electron pattern.

2. In an electron beam device of the synchronous-wave type, an electron coupler for interacting with the negative synchronous electron wave comprising:

a lumped-electrode bifilar helix coaxial with the electron beam path and having a twist of a sense opposite that of the electron cyclotron orbits and a pitch such that $$n=n_c\frac{f}{f_c}$$

where $n$ is the number of helix turns per unit length, $n_c$ is the sumber of cyclotron orbits per unit length, $f$ is the desired interaction frequency, and $f_c$ is the cyclotron frequency.

3. A device as defined in claim 2 which includes a second bifilar helix coaxial with and disposed downstream from the first and having a twist of a sense opposite that of the electron cyclotron orbits and a pitch satisfying the aforesaid equation.

4. A synchronous-wave signal energy oscillator comprising:

means for projecting an electron beam along a predetermined path;

means for establishing cyclotron resonance for electrons in said beam;

means disposed along said path for interacting with said beam to develop synchronous-wave energy thereon selectively in only the negative energy carrying mode;

and a load coupled to said interacting means and presenting a resistance thereto greater in value than the resistance value presented to said interacting means by said beam.

5. An oscillator as defined in claim 4 wherein said interacting means is a lumped-electrode bifilar helix coaxial with the electron beam path and having a twist of a sense opposite that of the electron cyclotron orbits and a pitch such that $$n=n_c\frac{f}{f_c}$$

where $n$ is the number of helix turns per unit length, $n_c$ is the number of cyclotron orbits per unit length, $f$ is the desired interaction frequency, and $f_c$ is the cyclotron frequency;

said load being coupled across the windings of said helix.

No references cited.

ROY LAKE, *Primary Examiner.*

D. HOSTETTER, *Assistant Examiner.*